(12) United States Patent
Ko et al.

(10) Patent No.: US 6,688,155 B2
(45) Date of Patent: *Feb. 10, 2004

(54) CALIBRATION ELEMENT FOR ADJUSTABLE NOZZLE

(75) Inventors: Alexander Sou-Kang Ko, Sunnyvale, CA (US); Duane DeMore, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/334,301

(22) Filed: Dec. 31, 2002

(65) Prior Publication Data

US 2003/0131648 A1 Jul. 17, 2003

Related U.S. Application Data

(63) Continuation of application No. 09/517,360, filed on Mar. 2, 2000, now Pat. No. 6,499,333.

(51) Int. Cl.[7] ............................................. B65G 65/00
(52) U.S. Cl. ......................................... 73/1.01; 73/1.79
(58) Field of Search ................................ 73/1.01, 1.57, 73/1.79, 1.86; 438/692; 134/151, 154, 33, 95.2, 902

(56) References Cited

U.S. PATENT DOCUMENTS

| | | | | |
|---|---|---|---|---|
| 5,997,653 A | * | 12/1999 | Yamasaka | 134/2 |
| 6,032,512 A | * | 3/2000 | Li | 73/1.79 |
| 6,074,950 A | * | 6/2000 | Wei | 438/692 |
| 6,106,635 A | * | 8/2000 | Hamada et al. | 134/33 |
| 6,146,541 A | * | 11/2000 | Goldstein et al. | 216/2 |
| 6,499,333 B1 | * | 12/2002 | Ko et al. | 73/1.01 |

* cited by examiner

*Primary Examiner*—Robert Raevis
(74) *Attorney, Agent, or Firm*—Moser, Patterson & Sheridan (57) ABSTRACT

In one aspect, a spin-rinse-dry chamber comprises an adjustable nozzle. A calibration element may be positioned in the spin-rinse-dry chamber at which the adjustable nozzle may be directed. Targets (for example cross-hairs in one embodiment) may be located on the calibration element at a position corresponding to where it is desired to direct a fluid flow from the adjustable nozzle. Another aspect provides a method of calibrating a spin-rinse-dry chamber having an adjustable nozzle comprising inserting a calibration element having a similar contour as a substrate into the spin-rinse-dry chamber. Fluid is then directed through the adjustable nozzle at a selected target position located on the surface of the calibration element.

20 Claims, 6 Drawing Sheets

CALIBRATION ELEMENT FOR ADJUSTABLE NOZZLE

CROSS-REFERENCE TO RELATED APPLICATIONS

This is a continuation of application(s) Ser. No. 09/517,360 filed on Mar. 2, 2000, now U.S. Pat. No. 6,499,333.

BACKGROUND OF THE INVENTION

1. Field of the Invention

The invention relates to substrate processing chambers. More particularly, the invention relates to calibration systems to calibrate adjustable nozzles in spin-rinse-dry systems.

2. Description of the Prior Art

Sub-quarter micron multi-level metallization is one of the key technologies for the next generation of ultra large scale integration (ULSI). The multilevel interconnects that are very important for this technology require reliable metallization and planarization of interconnect features. These features include contacts, vias, conductive lines, etc.

Aluminum and its alloys have been traditionally used to form features in semiconductor processing because of its high conductivity, its superior adhesion to silicon dioxide, its ease in patterning, and the ability to obtain it in a highly pure form. However, with the increase in circuit densities, copper is becoming a choice metal for filling sub 0.25 $\mu$m, high aspect ratio interconnect features on semiconductor substrates. Copper and its alloys have lower resistivities than aluminum as well as a higher electromigration resistance. These characteristics are important for supporting the higher current densities experienced at high levels of integration and increased device speed associated with the newer semiconductor devices.

Despite the characteristics of copper that make its use desirable for semiconductor device fabrication, there are limited alternative processes for depositing copper into very high aspect ratio features. Thus, improvements in electroplating processes as applied to substrate manufacturing are being explored, especially as applied to high aspect ratio features of substrates.

Spin-rinse-dry systems (SRD) are used in conjunction with electroplaters and other devices, and are often used to chemically remove deposits (using etchant fluids) from undesired locations of the surface of substrates following processing. SRD systems are applicable to wet processes (such as electroplating) in which a liquid such as electrolyte solution is applied to the substrate. The SRD systems also can remove dried chemicals from a surface of the substrate following electroplating. Removing these dry chemicals is desired because they may interfere with the desired layering uniformity, adhesive capabilities, effectiveness of the processing, or simply may provide an undesired surface finish. The SRD systems typically then spin at least one substrate at a time at sufficient angular velocities to remove remaining fluid droplets by centrifugal force.

Figure 1:
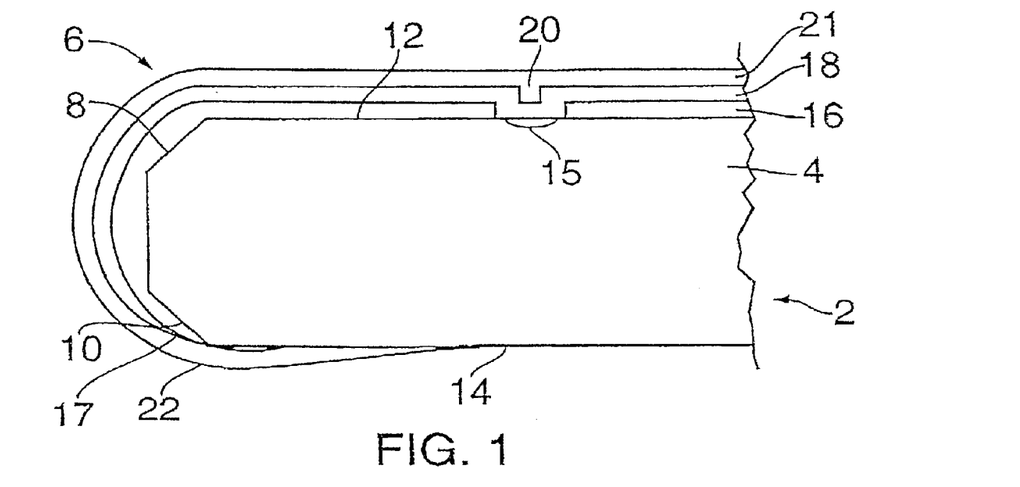
FIG. 1 shows a cross sectional view of a substrate having several layers deposited thereupon.

FIG. 1 is a partial cross section of an edge of a substrate 2 with one embodiment of layers deposited thereupon by successive processes, such as chemical vapor deposition (CVD), physical vapor deposition (PVD), and/or electroplating. The substrate 2 comprises an edge profile 6 that typically has a first bevel 8 adjacent a front side 12 and a second bevel 10 adjacent a backside 14. Doped regions 15 electrically connect to a feature 20 (such as a contact as shown) to form a portion of the circuitry of a semiconductor device. A dielectric layer 16 is deposited on the base 4 and is etched to form desired features, such as, for example, over the doped regions 15. A barrier layer 18, comprising Ti, TiN, Ta, TaN, and other known material is deposited over the dielectric layer 16. The barrier layer 18 reduces migration and diffusion of elements between adjacent layers and provides good adhesion of subsequent metal layer(s) to the dielectric 16. A conductive layer 21, typically copper, is deposited over the barrier layer 18, such as by electroplating, and fills the apertures and voids to form the interconnects between the layers.

Certain layers are not uniformly deposited around the edge profile to the backside 14 of the substrate. For example, the barrier layer 18 thickness reduces until it vanishes at merge point 17 thus permitting the conductive layer 21 to directly contact the underlying dielectric layer 16. The material of the conductive layer 21 at those locations where there is no barrier layer may diffuse into both the dielectric layer 16 and the silicon of the substrate 2, or vice versa. Such diffusion leads to "poisoning" of the semiconductor device. This poisoning of the device results in unpredictable operation of the device. Furthermore, some undesired backside deposits 22 may form on the backside 14, further increase the possibility of unwanted diffusion between these adjacent layers. In copper electroplating, the copper has a high diffusion capability and also can poison the device. This unwanted deposition can adversely affect the performance gains achieved using copper. It is preferred to remove this copper or other unwanted materials from the backside or from other surfaces where it may have been deposited.

Figure 2:
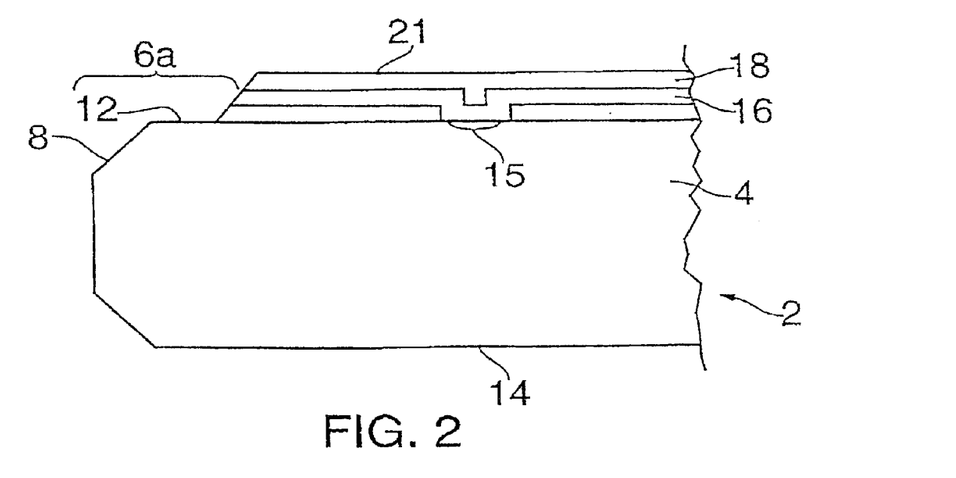
FIG. 2 shows a cross section of the substrate shown in FIG. 1 having portions of the layers removed to define an edge exclusion zone.

FIG. 2 is a partial cross section representing a desired deposition profile on the substrate 2. A portion of the deposited material (particularly the deposited material around the edge and backside 14) shown and described above in FIG. 1 is shown removed in FIG. 2. The dielectric layer 16, the barrier layer 18, and the conductive layer 21 each terminate a distance from the edge of the substrate 2 to form an edge exclusion zone 6a. In physical vapor deposition (PVD) and chemical vapor deposition (CVD) processing, which are conventionally dry processes, the ability to define the edge exclusion zone 6a is well known and is provided, for example, by use of clamp rings, shadow rings, and purge gases. This exclusion region prevents the formation of the deposition layer on the bevel, where it is easily flaked off. Electroplating typically requires the inclusion of a conductive layer in the exclusion region, to which power is applied to bias the substrate to attract ionic metal (typically copper) thereto to form the electroplated layer. This layer is typically an extension of a copper seed layer deposited over the face or field of the substrate prior to electroplating deposition.

However, this material must be removed from the edge, side, and back to allow the formation of edge exclusion zone 6a as shown in FIG. 2 after electroplating. The edge is complete to exclusion zone 6a typically extends from about 1 mm to about 3 mm or more along the upper surface 12 of substrate 2. In further processing, providing an edge exclusion zone 6a shown in FIG. 2 reduces the likelihood of the edge deposits being dislocated from the substrate 2, thereby contaminating the substrates 2. There is also less likelihood of unwanted diffusion through the layers. In processing, it may be desired to provide an edge exclusion zone along the upper surface 12 which is a surface in such processes as PVD or CVD over which the substrate 2 can be clamped or shadowed. It is desirable to limit deposits applied to such an exclusion zone since some of the deposits can be removed during processing, thereby possibly contaminating the substrates.

The fluid in many prior art SRD systems is applied to the substrate in the form of a fluid stream. A robot assembly as generally known in the art is used for the transporting of wafers to or from the SRD chamber. In many SRD systems, nozzles are used to adjust a location where the fluid stream impinges upon the upper and the lower surfaces of the substrate.

Nozzles in SRD systems can often be adjusted to alter the location where the fluid stream impinges on the substrate and the angle that the fluid stream is applied to the substrate. Accurate adjustment of the nozzle is desirable to ensure adequate coverage of an entire upper or lower surface of the substrate by the fluid applied by the fluid stream. There is typically a relatively small surface area upon the substrate that the fluid stream can impinge upon such that the fluid covers the entire surface of the substrate. Calibration is the process of adjusting the nozzles to provide suitable coverage.

Unfortunately, the calibration of adjustable nozzles is quite sensitive. As such, the adjustable nozzles may become misaligned during shipping, normal use, or inadvertent contact. However if the fluid stream does not impinge as desired upon the substrate, which may occur if the nozzle is knocked out of alignment and/or is not calibrated, then desired portions of the substrate may not be covered adequately by the fluid stream. Alternatively different surfaces of the substrate may be non-uniformly rinsed, thereby failing to adequately remove the deposits or dried chemicals as desired. While repositioning the adjustable nozzles is not difficult in itself, calibrating the adjustable nozzles properly such that the nozzle is directed at a desired location on the substrate whereby the fluid completely rinses the entire substrate is challenging.

Therefore, a need exists in the art for a system in which the adjustable nozzles in a spin-rinse-dry systems that can be inexpensively and repeatedly calibrated such that the adjustable nozzles apply fluid substantially uniformly over the entire surface of the substrate.

SUMMARY OF THE INVENTION

In one aspect, a spin-rinse-dry chamber comprises an adjustable nozzle. A calibration element may be positioned in the spin-rinse-dry chamber at which the adjustable nozzle may be directed. Targets (for example cross-hairs in one embodiment) may be located on the calibration element at a position corresponding to where it is desired to direct a fluid flow from the adjustable nozzle.

Another aspect provides a method of calibrating a spin-rinse-dry chamber having an adjustable nozzle comprising inserting a calibration element having a similar contour as a substrate into the spin-rinse-dry chamber. Fluid is then directed through the adjustable nozzle at a selected target position located on the surface of the calibration element.

The present invention is particularly applicable to spin-rinse-dry chambers to remove deposits or chemicals after electroplating processes have been applied to substrates.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

After considering the following description, those skilled in the art will clearly realize that the teachings of the invention can be readily utilized in any process assembly in which an adjustable nozzle directs a fluid at a substrate 2, in particular a spin-rinse-dry (SRD) system. A calibration element 220 (which in one embodiment is a transparent plate or disk) can be temporarily inserted into the SRD system in a manner similar to how substrates 2 are inserted into the SRD system. The calibration element is then utilized to adjust the adjustable nozzles in the SRD system such that the fluid applied from the adjustable nozzles adequately cover substrates to be inserted into and rinsed in the SRD system. Such SRD systems are often used in substrate processing following such processes as electroplating. The general processing of a substrate within the SRD system is described. Finally, the configuration and use of one embodiment of calibration element is described.

Figure 5:
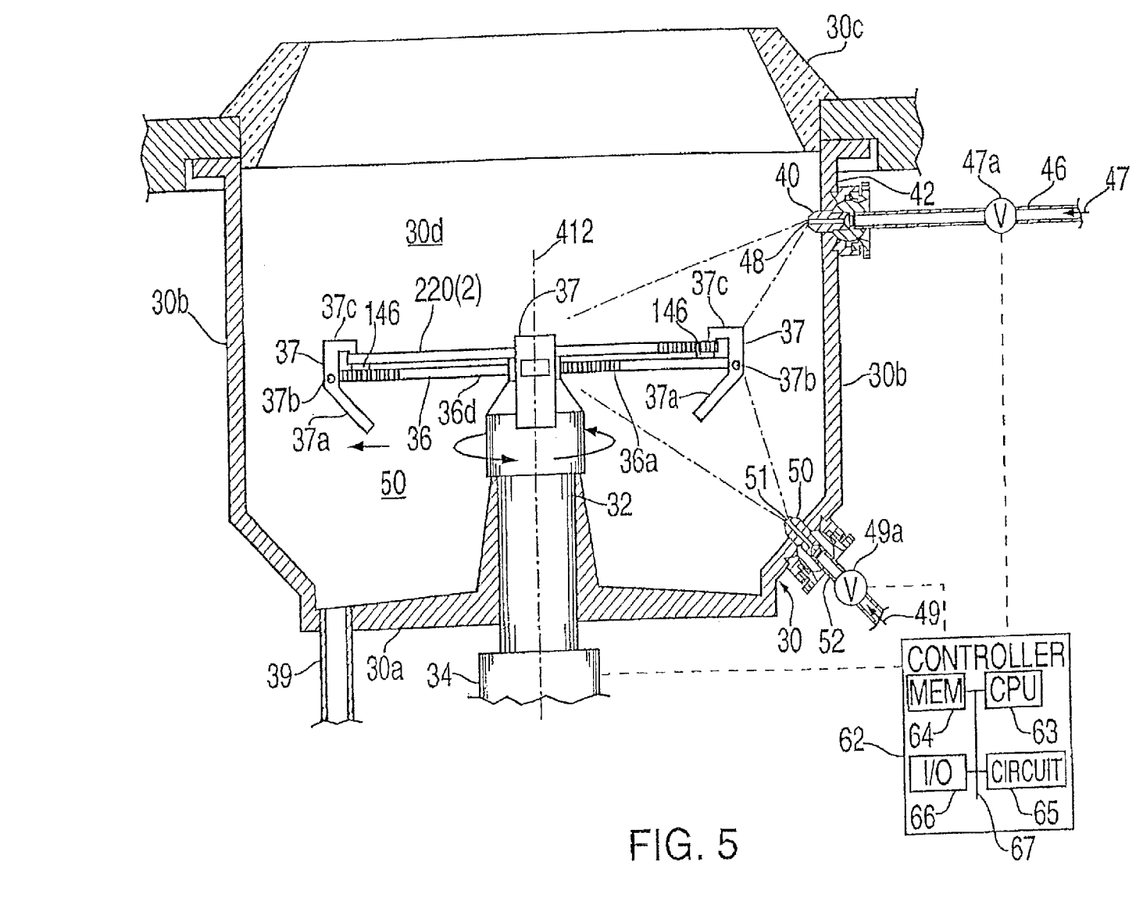
FIG. 5 shows a side view of the spin-rinse-dry system shown of FIG. 4.
Figure 6:
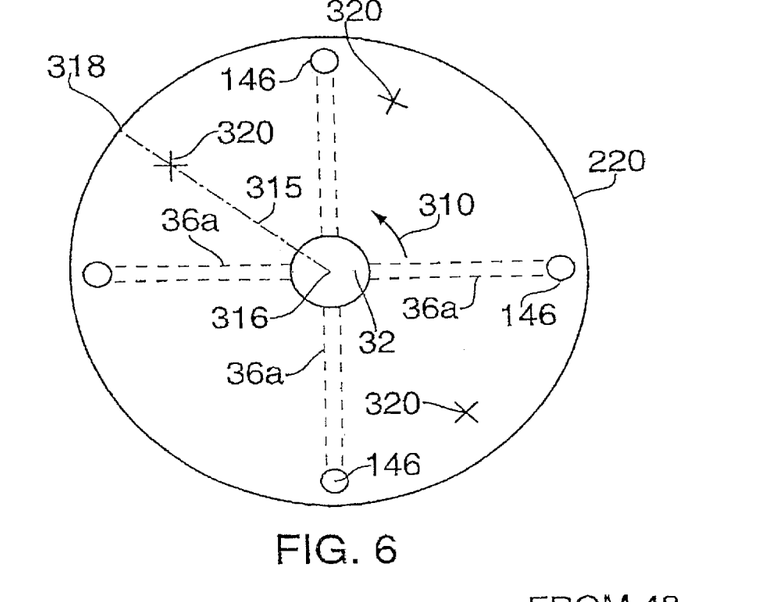
FIG. 6 shows a top view of one embodiment of calibration element to be used in the spin-rinse-dry system shown in FIG. 4.
Figure 7:
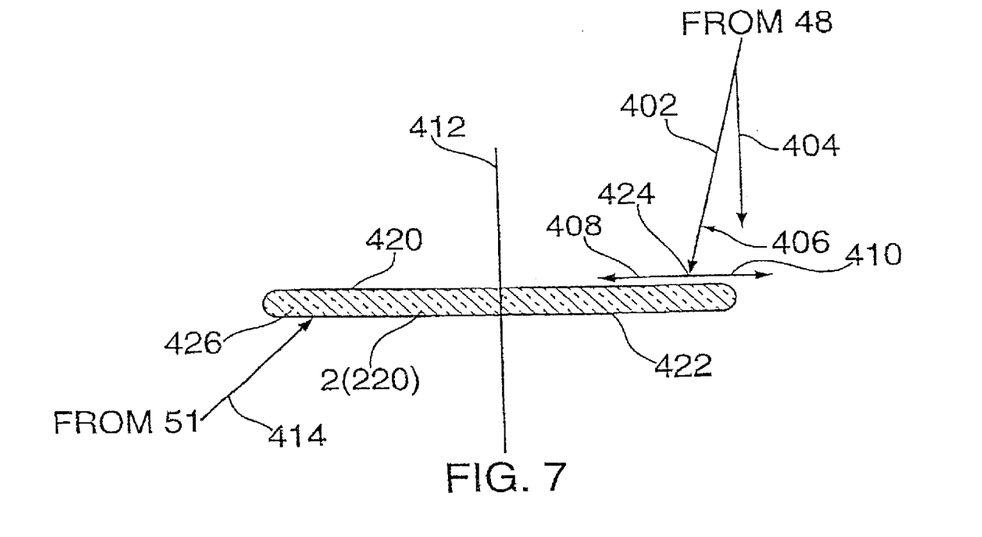
FIG. 7 shows a side cross-sectional view of the calibration element shown in FIG. 6.

As shown in FIGS. 6 and 7, the calibration element 220 is preferably plate or disk like so that it can be handled and located into (or removed from) SRD chamber in a similar manner as a substrate, and is preferably formed of a clear material such as quartz or a plastic. Targets are created on the disk by painting, inscribing, forming (or some other marking technique) thereof in a surface, or in the material, of a calibration element. When the calibration element is located in an SRD in a position which mimics the positioning of a substrate to therein, the target(s) is at a desired three-dimensional location at which fluid from the fluid nozzles of the SRD may be directed thereat as shown in FIG. 5. The calibration element 220 provides similar fluid solid interactive characteristics as the substrate 2 when fluid is applied from adjustable nozzles to an outer surface thereof.

Operation of a SRD System

Figure 3:
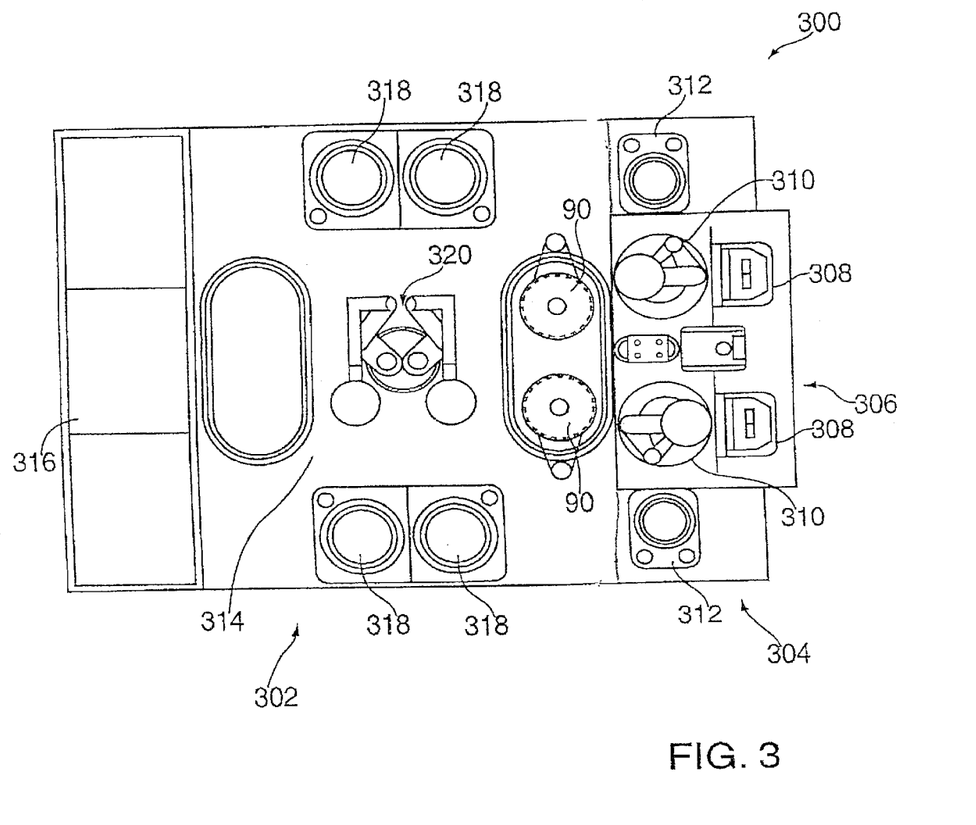
FIG. 3 shows a schematic diagram of a top view of a process assembly comprising a spin-rinse-dry system of one embodiment of the present invention.

FIG. 3 shows an embodiment of process assembly 300 to be used in conjunction with one embodiment of the present invention. The process assembly 300 comprises a back end process 304 and an electroplating portion 302. The back end process 304 comprises a platform 306, a cassette 308, a back end robot 310, and a wafer aligner 312. In FIG. 3, there are two of each of the above elements 306, 308, 310, and 312 in the back end process 304 that are configured to provide parallel processing. The electroplating portion 302 comprises a transfer chamber 314, a transfer chamber 314, an electrolyte refresher 316, an electrolyte cell 318, a robot 320, and an SRD system 90. The above process assembly 300 is produced by Applied Materials of Santa Clara, Calif. Other process assemblies that provide an inverted handoff, carry wafers in an inverted position, or flip wafers are envisioned to be within the scope covered, such as electroplating, chemical vapor deposition (CVD), physical vapor deposition (PVD), and etching.

The back end process 304 receives substrates from cassettes to transfer to the electroplating portion 302, and transfers substrates from the electroplating portion 302 to transfer back to the cassettes 308. The platform provides a location where wafers can be loaded. The cassette 308 supports the substrate in a position such that the back end robot 310 can pick up the substrate 2, and that the back end robot 310 can leave a substrate. The back end robot 310 transfers substrates 2 between the components of the back end process 304, and to a position that can be accessed by the robot 320. The wafer aligner orients the substrate in a known position.

The electroplating portion performs the necessary handling and processing associated with electroplating of substrates 2. The transfer chamber 314 provides apace that enables the robot 320 to perform whichever robot motions are necessary to transfer substrates 2 to the desired locations within the electroplating portion 302. The electrolyte refresher 316 refreshes the electrolyte, thus maintaining the desired chemistry of the electrolyte to be applied to the electrolyte cell(s) at a desired level. The robot 320 transfers substrates between the different components in the electroplating portion 302, and performs whatever substrate processing techniques that are necessary such as chucking and dechucking, flipping of substrates, etc. The SRD chamber 30 performs spin, rinse, and drying operations on the substrate 2 as described below.

During operation, substrates 2 are picked up by back-end robot 310 and transferred to the wafer aligner 312. The wafer aligner aligns the substrates 2, and the substrate is then picked up by the back end robot 310. The back end robot 310 then transfers the substrates to a position where they can be accessed by the robot 320. The robot 320 then orients the substrate 2 in a position where the substrate can be inserted into the electrolyte cell 318, then transfers the substrate into the electrolyte cell 318. After the substrate is processed in the electrolyte cell 318, the robot removes the substrate from the electrolyte cell 318 and transfers the substrate into the SRD chamber 30. Processing then occurs within the SRD chamber 30. The robot then removes the substrate 2 from the SRD chamber 30 and transfers the substrate to the back end robot 310. The back end robot then transfers the substrate to the cassette 308 into a position where the substrate 2 may be further processed.

SRD system 90 is thus used following an electroplating process that occurs in electrolyte cell 318, in which the electroplating process utilizes an electrolyte to deposit a metallic layer upon the substrate 2. After the electroplating process, unwanted deposits and/or residual chemicals remain on the substrate 2 which require removal prior to further processing of the substrate or, alternatively, prior to final removal of the substrate 2 from the process assembly 300.

Robot 320 is configured to transfer substrate 2 (or calibration element 220) between the various components of the electroplating portion 302 and the back end process 304. Such robots typically not only translate the substrates 2 along a horizontal plane, but can also move the substrate in a vertical direction such that the substrate can be transported as desired within the different elements of the process chamber, and may even flip a substrate into an inverted position. Multiple process chambers running different processes may be attached to a single transfer chamber 312 such that a substrate 2 can be transferred between the multiple processes to perform a desired series of sequential processing operations and/or cleaning.

Figure 4:
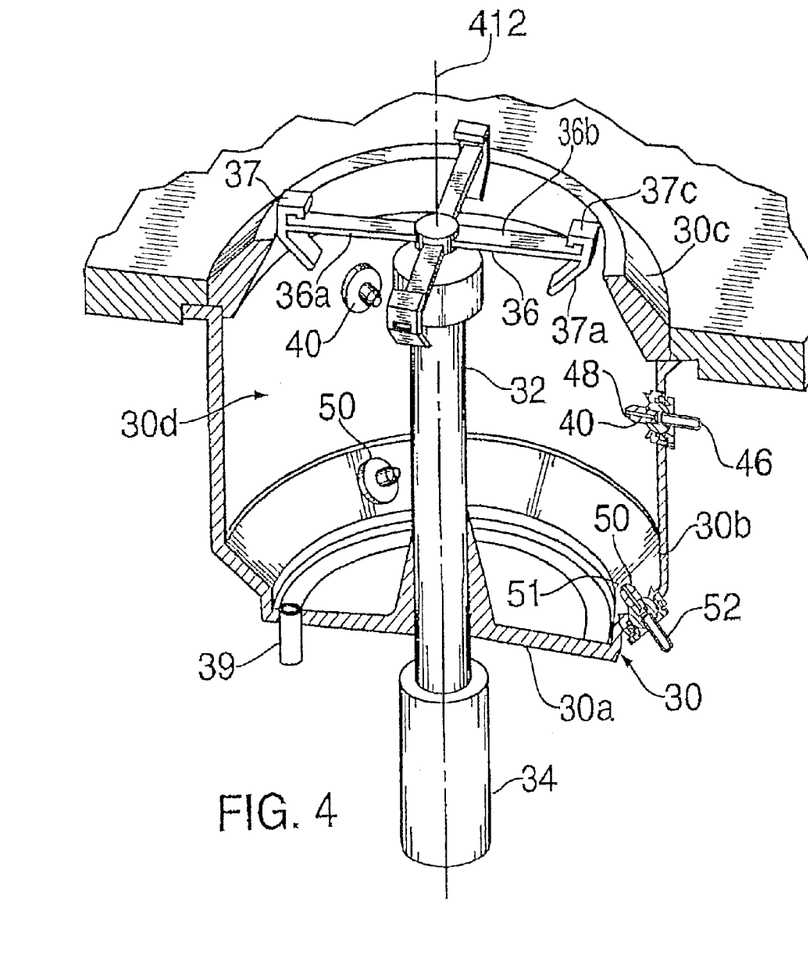
FIG. 4 shows a perspective, partial cross-sectional view of one embodiment of spin-rinse-dry systems of the present invention.

The SRD system 90 comprises an SRD chamber 30 depicted in greater detail in FIGS. 4 and 5. FIG. 4 is a schematic perspective view of the SRD chamber 30 of one embodiment of the present invention, incorporating rinsing and dissolving fluid inlets. FIG. 5 is a side view of the SRD chamber 30 of FIG. 4 and shows a substrate 2 or a calibration element 220 located within the SRD chamber 30. In actuality, the SRD chamber 30 may be a stand-alone unit or may be integrated into the process assembly 100. The SRD chamber 30 comprises bottom 30*a* and a sidewall 30*b*, and an upper shield 30*c* which collectively define a chamber bowl 30*d*, where the shield attaches to the sidewall and assists in retaining the fluids within the chamber. Alternatively, an SRD chamber comprising a removable upper cover as described above could also be used. The SRD chamber 30 includes a pedestal 36 (see FIG. 5) that is configured to support the substrate 2 or calibration element 220. The SRD chamber 30 has a plurality of upper adjustable nozzles 40 and a plurality of lower adjustable nozzles 50 mounted therein and directed within the SRD chamber 30.

The pedestal 36 includes a pedestal support 32, a plurality of pedestal arms 36*a*, and a pedestal actuator 34. The pedestal 36 supports the substrate 38 (shown in FIG. 5) on contact pads 146 attached to pedestal arms 36*a* during processing. A pedestal actuator 34 rotates the pedestal about axis 412 to spin the substrate, and also raises and lowers the pedestal 36 as necessary. FIG. 4 shows the pedestal 36 in the raised position while FIG. 5 shows the pedestal 36 in the lowered position. The SRD chamber 30 is in communication with the transfer chamber 106 to permit loading of (or removal of) the substrate 2 or the calibration element 220 from the transfer chamber 106 using a robot device of the type generally known in the art.

The substrate 2 may be held in place on the pedestal 36 by a plurality of clamps 37. The clamps 37 pivot with centrifugal force in a manner to engage the substrate preferably in the edge exclusion zone 6*a* of the substrate 2. In one embodiment, the clamps 37 engage the substrate 2 only when the substrate lifts off the pedestal 36 when the pedestal arms 36*a* are spun at a sufficient angular rate. Vacuum passages (not shown) may also be used in addition to, or instead of other holding elements (e.g., clamps 37) to secure the substrate 2 to the pedestal 36.

The plurality of pedestal arms 36*a* are configured with small cross-sectional areas while providing the necessary strength to support the wafer. Minimizing the cross-sectional area of the pedestal arms 36*a* is important so that the fluid supplied from the second set of adjustable nozzles 50 may impact as much surface area on the lower surface of the substrate as is practical. An outlet 39 allows fluid to flow under the influence of gravity out of a drain that is provided at the lowest point in the chamber. The terms "below", "above", "bottom", "top", "up", "down", "upper", and "lower" and other positional terms used herein are shown with respect to the embodiments in the figures and may be varied depending on the relative orientation of the processing apparatus.

A conduit 46, through which a first fluid flows in a direction indicated by arrow 47 in FIG. 5, is connected to a valve 47*a*. The conduit 46 may be hose, pipe, tube, or other fluid containing and transporting conduits. The conduit 46 is preferably sufficiently rigid such that it is not deformed or displaced when fluid is applied thereto. The valve 47*a* controls the flow of the first fluid 47 and may be selected from a variety of valves including a needle, globe, butterfly, or other valve types and includes a valve actuator, such as a solenoid, that can be controlled with a controller 62 described below. The conduit 46 connects to a first fluid inlet 40 that is located above the substrate and includes a mounting portion 42 to attach to the chamber. The first fluid inlet 40 is shown with a single first adjustable nozzle 48 to deliver a first fluid 47 under pressure onto the substrate upper surface. However, multiple adjustable nozzles 48 could be used and multiple fluid inlets could be positioned about the inner perimeter of the chamber. Preferably, adjustable nozzles 48 that are positioned above the substrate 2 are outside a cylinder geometrically vertically generated by the diameter of the substrate to lessen the risk of the adjustable nozzles 48 dripping on the substrate 2. The first fluid inlet 40 could be mounted in a variety of locations, including through a removable cover positioned above the substrate as described above.

Figure 8:
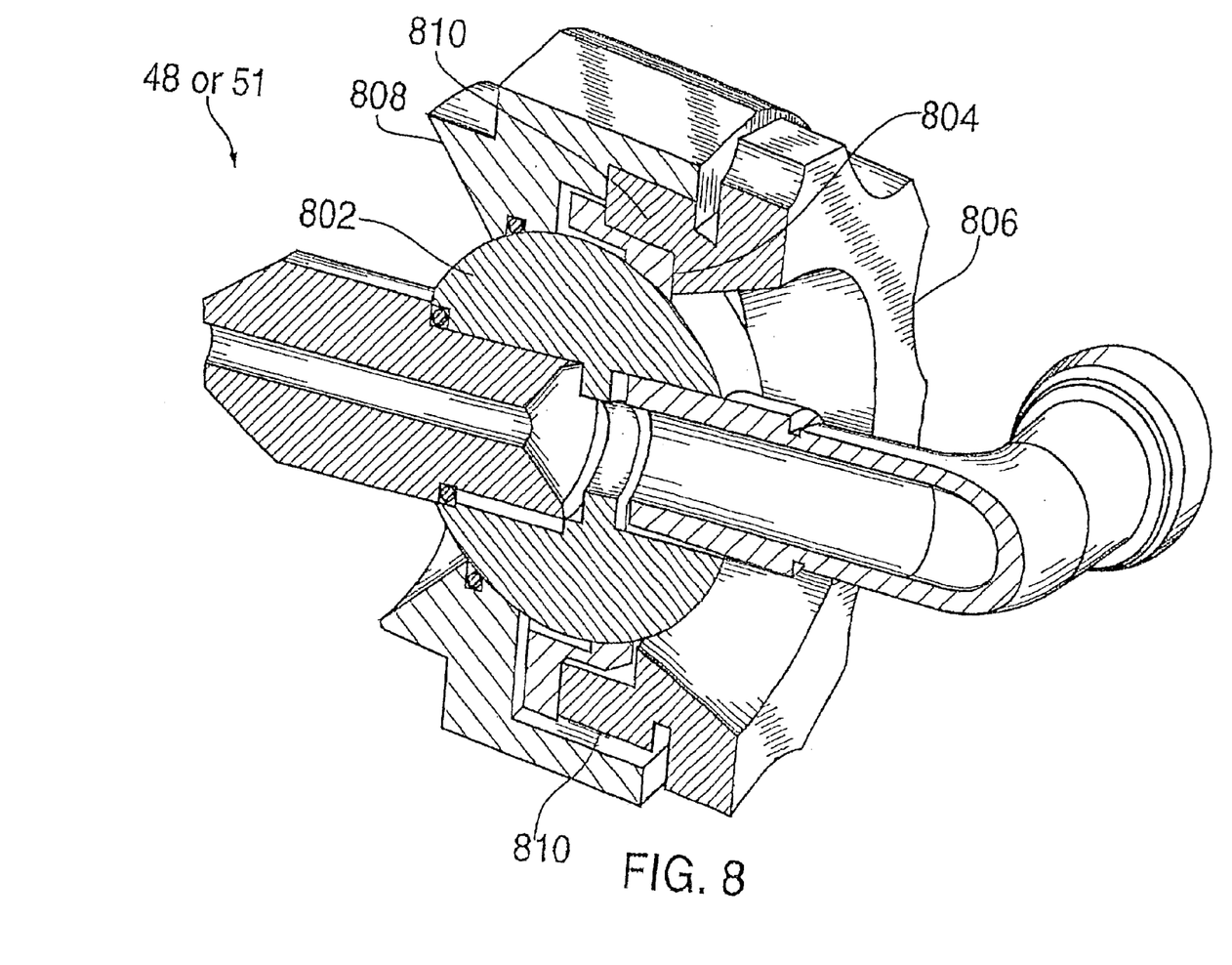
FIG. 8 shows a cross sectional view of one embodiment of adjustable nozzle to be used in the FIG. 4 spin-rinse-dry system.

The adjustable nozzles 48 and 51 can be any design that enables adjustment of direction of output flow. The adjustable nozzles 48 or 51 in one embodiment of the present invention comprise an adjustable ball 802 and socket 804 nozzle with an engaging clutch 806 (that may be hand-tightened) and a nozzle body portion 808 as shown in FIG. 8. The engaging clutch 806 is adjustably coupled to the body portion 808 by mating threaded surfaces 810. Tightening the engaging clutch 806 secures one of adjustable nozzles 48 or 51 in position. To adjust an adjustable nozzle 48 or 51, the clutch 806 is released by hand-loosening the engaging clutch 806 to permit the particular adjustable nozzle 48 or 51 to be displaced freely within the ball-and-socket joint. When the adjustable nozzles 48 or 51 are adjusted to the correct position (e.g. calibrated), each engaging clutch 806 is re-tightened. Each one of a plurality of adjustable nozzles 48 (only one is shown) is in communication with conduit 46 that supplies fluid to be used during the cleaning and/or the rinsing of the substrate 2. Valve 47*a* controls the fluid flow through conduit 46. Examples of fluids that may be used to clean the substrate include water, water mixed with a solvent, detergent, or etchant, etc., or a fluid that can etch at least a portion of an external surface of the substrate.

Similar to the conduit 46 and related elements described above, a second conduit 52 is connected to a control valve 49*a* and a second fluid inlet 50 with a plurality of second adjustable nozzles 51) only one is shown. Each one of adjustable nozzles 51 is in communication with conduit 52 that supplies fluid in a direction indicated by arrow 47 that is supplied from a controllable fluid supply (not shown). The second fluid inlet 50 is shown below the substrate 2 and angled upward to direct a second fluid under the substrate through the second adjustable nozzle 51. Similar to the first fluid inlet, the second fluid inlet 50 comprises an adjustable nozzle 51, a fluid inlet 50, and associated mounting elements and connectors. The second fluid inlet 50 may actually comprise a plurality of second fluid inlets spaced radially around the SRD chamber 30. Each fluid inlet extends into the chamber at a variety of positions. For instance, if the flow is to be directed toward the center of the substrate, then the adjustable nozzles could be extended radially inward toward the center of the substrate. By comparison, if it is desired to direct the fluid flow closer to the chamber periphery, then adjustable nozzles 51 would be directed back toward the chamber periphery. The adjustable nozzle 51 is calibrated in a similar manner to adjustable nozzle 48, as described below.

Valve 49*a* controls the fluid flow through conduit 52. The pressure at which the fluid is applied to the conduits 46, 52 from the fluid supply may be determined based upon the specific configuration of the adjustable nozzles 48, 51, respectively. The substrate is rotating as a result of the pedestal arms 36*a* of the pedestal 36 rotating as the adjustable nozzles 48, 51 apply a straight stream of fluid at the surface of the substrate 2. The fluid(s) is generally delivered by adjustable nozzles 48, 51 in a spray pattern, which may be varied depending on the particular adjustable nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) for a 200 mm substrate. The principles in locating the fan of fluid would remain the same regardless of the pattern.

Assume that the fluid stream imparted by adjustable nozzles 48, 51 applies a continuous fluid stream over the surface (upper or lower) of the substrate 2 at which it is directed. For example, in FIG. 6, the fluid stream extends continuously along dotted line 315 from the center 316 of the wafer 2 to the periphery 318. As the substrate is spun about axis 412 of FIG. 7, then each point on the surface of the substrate 2 will be exposed to the fluid. An etching solution may be applied as a component of the fluid to assist in the etching of an oxide on a substrate surface.

The controller 62 could individually control such parameters as the application of fluids from the adjustable nozzles 48, 51, the flow rates from the adjustable nozzles 48 or 51, timing of operation of the SRD chamber and any associated valving, as well as the angular velocity and timing of the spin cycle(s) of the pedestal 36. The controller 62 could be remotely located, for instance, in a control panel or control room and the plumbing controlled with remote actuators.

The controller 62 may be configured as a microcontroller, a microprocessor, a general purpose computer, or any other known applicable type of computer. The controller 62 comprises a central processor unit (CPU) 63, a memory 64, related circuits 65, an input/output circuit (I/O) 66, and a bus 67. The CPU 63 communicates with the memory 64, the related circuits 65 and the I/O 66 over the bus 67. The CPU 63 controls operation of the valves 47*a*, 49*a* and the pedestal actuator 34 by issuing commands via the I/O. The CPU 63 receives input from temperature sensors located throughout the SRD chamber 30. The CPU 63 also receives operating commands and set-limits from the related circuit, the latter which includes a location for user input (using a keyboard and/or a mouse, for example), as well as a location for user display (using a cathode-ray display or LCD display, for example). The integration of the above elements associated with the controller 270 is well known, and will not be further detailed herein.

In one embodiment, the substrate 2 is mounted with the SRD chamber 30. For such an arrangement, the first fluid inlet 40 would generally dispense a rinsing fluid (typically deionized water). Consequently, the backside of the substrate would be mounted facing down and a fluid flowing through the second fluid inlet 50 would be a dissolving fluid, such as an acid, comprising hydrochloric acid, sulfuric acid, phosphoric acid, hydrofluoric acid, or other dissolving liquids or fluids, depending on the material to be dissolved.

In operation, when the pedestal 36 is in the raised position, shown in FIG. 4, a robot (not shown) places the substrate onto the pedestal 36. The pedestal 36 then lowers the substrate to a processing position where the substrate is vertically disposed between the first fluid inlet(s) 40 and the second fluid inlet(s) 50. Generally, the pedestal actuator rotates the pedestal 36 between about 5 to about 5000 rpm (usually between 20 and 2000 rpm for a 200 mm substrate). The rotation causes the lower end 37a of the clamps to rotate outward about pivot 37b due to centrifugal force, toward the periphery of the chamber sidewall 30b. This clamp rotation forces the upper end 37c of the clamp inward and downward to center and hold the substrate 38 in position on the pedestal 36. The clamp 37 contacts the substrate 2 along the substrate edge, if at all. The clamps may rotate into position without touching the substrate and hold the substrate in position on the pedestal 36 only if the substrate significantly lifts off the pedestal during processing.

With the pedestal 36 rotating the substrate 38, a first fluid such as water is delivered onto the substrate through the first fluid inlet 40. A second fluid, such as an acid, is delivered to the backside surface through the second fluid inlet 50 to remove any unwanted deposits formed on the edges or along the backside of the substrate 2. The dissolving fluid chemically reacts with the deposited material, dissolves the material, and then flushes the material away from the substrate backside and other areas where any unwanted deposits are located. Rinsing fluid is concurrently applied to the front side of the substrate to protect the deposited layers upon the front side of the substrate 2 from the action of the dissolving fluid. The first fluid inlet 40 and the second fluid inlet 50 are each positioned for optimal performance depending on the substrate configuration. The respective flow rates through the adjustable nozzles 48, 51, the spray patterns, and the amount and type of deposits to be removed from the substrate, among other factors effect the performance of the adjustable nozzles 48, 51. In some instances, the rinsing fluid could be routed to the second fluid inlet 50 after a dissolving fluid has dissolved the unwanted deposits, thereby rinsing the backside of the substrate 2. In other instances, an auxiliary fluid inlet (not shown) connected to flow rinsing fluid on the backside of the substrate 2 could be used to rinse any dissolving fluid residue from the backside. After rinsing the front side and/or backside of the substrate, the fluid(s) flow is stopped and the pedestal 36 continues to rotate, spinning the substrate at a rate sufficient to effectively dry the surface.

The SRD chamber 104 is also used to remove the unwanted deposits along the edge of the substrate to create the edge exclusion zone shown in FIG. 2. By adjustment of the orientation and placement of the adjustable nozzles, the flow rates of the fluids, the rotational speed of the substrate, and the chemical composition of the fluids, the unwanted deposits could be removed from the edge and/or edge exclusion zone of the substrate as well. Thus, limiting dissolution of the deposited material on the front side surface may not necessarily include limiting dissolution of deposited material in the edge or edge exclusion zone 60 of the substrate. Also, preventing dissolution of the deposited material on the front side surface is intended to include at least preventing the dissolution so that the front side with the deposited material is not impaired.

One method of accomplishing the dissolution process that produces the edge exclusion zone 6a shown in FIG. 2 is to rotate the substrate 2 at a slower speed, such as about 100 to about 1000 rpm, while dispensing the dissolving fluid on the backside of the substrate. The centrifugal force moves the dissolving fluid to the edge of the substrate and forms a layer of fluid around the edge due to surface tension of the fluid. The dissolving fluid thus overlaps from the backside to the front side in the edge area of the substrate. The rotational speed of the substrate 2 and the flow rate of the dissolving fluid may be used to determine the extent of the overlap onto the front side. For instance, a decrease in rotational speed or an increase in flow may result in more fluid travelling to the opposing side of the substrate from where it originally impinged. Additionally, the flow rate and flow angle of the rinsing fluid delivered to the front side can be adjusted to offset the layer of dissolving fluid impinging onto the edge and/or frontside of the substrate. In some instances, the dissolving fluid may be initially applied to the front, back or both sides of the substrate without applying the rinsing fluid to obtain the edge and/or edge exclusion zone removal. The rinsing/dissolving process described herein can then be performed.

In another arrangement, the substrate is mounted with the substrate backside facing upward. This embodiment is more in keeping with standard electroplating processes where the plated surface is downwardly oriented. The clamps 37 could be used to contact the substrate in the edge exclusion zone, as described above. The advantage of having a substrate inverted would be less flipping of the substrate as the substrate is transported between chambers during subsequent processing steps. While similar to the above described process and apparatus in FIG. 4, the rinsing and dissolving could be done, however, by switching the fluids supplied through the first fluid inlet 40 and the second fluid inlet 50. Thus, the first fluid that flows through the first fluid inlet is the dissolving fluid while the second fluid that flows through the second fluid inlet is the rinsing fluid. In such an instance, the second fluid flow rate would preferably be greater than the first fluid flow rate to protect the substrate front side from the dissolving fluid.

Use of the Calibration Element

Calibration element 220, shown in FIGS. 6 and 7, is positioned on the pedestal 36 to aid the determination of the direction that the adjustable nozzles 48 and 51 are to be adjusted, to enhance the effectiveness of the wash and rinse cycles of the SRD chamber 30. The calibration element 220 may be removably positioned in the SRD chamber in a similar manner as the substrate. The calibration element may be considered as a model of a substrate. A fluid jet may be applied within an SRD chamber at the calibration element to provide an indication of how the substrate will interact to the fluid jet. For example, if a desired surface of the calibration element that is positioned in the SRD chamber is not suitable covered when fluid is applied from a fluid jet, then the corresponding surface of the substrate will also not be covered when inserted in the SRD chamber.

Fluid being applied from one, or a plurality of, the adjustable nozzles 48, 51 may be oriented to direct fluid in a spray oriented along a line. The fluid dynamics shown in FIG. 7 and described below indicate why fluid applied to a surface of the calibration element at a relatively small region extends and covers a relatively large area of the calibration element. One or more adjustable nozzles direct fluid at a calibration element that spreads across a continuous line indicated as 315 (in FIG. 6). The continuous line 315 extends from the center 316 to the periphery 318 of the substrate 2. If fluid is being applied continuously from the adjustable nozzle, the entire surface of the substrate at which the adjustable nozzle is directed will be covered at one time during the 360-degree rotation of the substrate 2. If the fluid is not applied across the continuous line 315, then some portion of the surface of the substrate 2 will likely not be covered during rotation of the substrate through 360 degrees.

FIG. 7 shows the components of the fluid stream 402 impinging on a substrate 2 or calibration element 220. The calibration element 220 may be similar in cross-sectional contour to the substrate, but the targets 320 should be positioned in space in the same location as the substrate. The calibration element may be selected of a material having similar frictional characteristics as a substrate so the interaction between the fluid jet and the calibration element provides an indication of the frictional interaction between the fluid jet and the substrate. The fluid principles discussed herein apply to the fluid stream impinging upon either the substrate 2 or the calibration element 220. The fluid stream 402 in the FIG. 7 embodiment is directed at an angle between vertical and horizontal, and thus comprises a vertical component 404 and a horizontal component 406. When the fluid stream 402 impinges the substrate 2, the horizontal component 406 of the vector 402 in the fluid stream 406 tends to propel at least some of the fluid (including any chemicals included in the fluid) toward the axis 412. The fluid spattering across the surface of a substrate 2 tends to spread the fluid in many directions across the surface of the substrate, but the fluid tends to maintain the inward travel as indicated by arrow 408. The friction between the fluid and the substrate tends to retard the inward horizontal travel of the fluid. Rotation of the substrate 2 about axis 412 at a sufficient velocity (e.g. 200 RPM) propels the fluid originally contained in fluid stream 402 outwardly under the influence of centrifugal force (as indicated by arrow 410). The combination of the motion of fluid in the directions indicated by arrow 408 and 410 is sufficient to apply fluid from the fluid jet across line 315 indicated in FIG. 6. Therefore, as the calibration element rotates through 360 degrees, the fluid from the fluid stream covers the entire upper surface 420 of the substrate 2.

Another fluid stream shown in FIG. 7, indicated as arrow 414, is applied to the backside 422 of the substrate 2 or calibration element 220 from adjustable nozzle 51 of FIG. 2 in a similar manner as how fluid is applied by fluid stream 402 to the upper surface 420 by adjustable nozzle 48. One difference between the principles of the fluid streams 402 and 414 is that gravity does not tend to force the fluid from the fluid stream 414 towards the backside. Gravity tends to force the fluid from fluid stream 402 towards the upper side 420. The fluid stream will include a slight downward arc which tends to make the stream impinge the substrate in a direction more perpendicular to the surface of the substrate then when the fluid left the nozzle. Therefore, slightly different fluid dynamic equations apply between the application of fluid streams 402 and 414. As such, the horizontal compared to vertical components of the two fluid streams 402 and 414 differ slightly from each other. However, with proper calibration of the adjustable nozzles 50, fluid from continuously applied fluid stream 414 is sufficient to apply fluid to the entire backside of a substrate 2 (or calibration element 220) when the substrate 2 is rotated about axis 412.

There are respective target points 424, 426 on respective surfaces 420, 422 at which respective fluid streams 402 and 414 should be directed from respective adjustable nozzles 48 and 51 to cover respective surfaces 420, 422. Determining the precise location of points 424, 426 on the respective upper surface 420 and backside 422 of the substrate 2 is often a matter of trial and error, but once these points have been determined for a specific size of substrate 2 within a specific SRD chamber, then all other similar sized substrates should share the same target point. The calibration element 220 is provided with targets 320 that correspond to the location of points 424 and 426 on the substrate 2. The targets 320 thereby provide a repeatable reference location on the calibration element for aiming the fluid jet that corresponds to the points 424, 426 on surfaces of the substrate 2 at which it is desired to aim the fluid jet.

During operation, a calibration element with one or more targets 320 can be selected to be inserted into the SRD chamber 30 for use with a specific substrate. The adjustable nozzle 48, 51 are then calibrated by adjusting the fluid stream therefrom to impinge upon the target 320 located on the calibration element 220. The fluid stream impinging upon the calibration element is observed initially with the calibration element stationary, and then with the calibration element rotating on the pedestal 36 (at a similar velocity that the substrate rotates on the pedestal as described above). The spreading of the fluid from the fluid stream across both the stationary and rotating calibration element provides an indication of how the fluid will interact with the respective stationary and rotating substrate. The calibration element 220 is then removed from the SRD chamber 30, and a substrate is inserted into the SRD chamber. In addition, as the fluid stream is applied with different pressures through the adjustable nozzles 48 and 51, the velocity at which the fluid stream impinges the substrate differs. Therefore, a single calibration element associated with a single SRD chamber 30 and substrates of a single size may have multiple targets located thereupon based upon the pressure at which the fluid is being applied to the adjustable nozzles 48, 51.

The adjustable nozzles is calibrated for that specific substrate, and fluid from the appropriate adjustable nozzles 48, 51 will spread out under the influence of momentum, gravity, friction, centrifugal force, etc. as described above to completely cover line 315 formed on the respective surface. Therefore, the entire surface will be covered as the substrate rotates through 360 degrees. Substrates having different sizes and configurations each have a different calibration elements 220 (that have targets at different locations) that are used to calibrate the adjustable nozzles 48, 51 to each specific substrate configuration and size. Since different substrates 2 and calibration elements 220 using the same SRD chamber 30 have the same cross sectional configuration, the fluid impinging upon multiple substrates 2 and calibration elements 220 from the fluid stream 402 and the fluid stream 414 will cover the upper surface 420 and the backside 422 similarly in the different substrates of the same diameter and surface condition. Therefore, the location 424 and 426 at which the fluid streams 402 and 414 impinge upon the substrate 2 correspond with the cross sectional location at which the fluid impinges upon the calibration element 220 using the same SRD chamber 30.

Targets 320 are located on the calibration element 220 at a position that corresponds to the points 424 and 426 that it is desired for the respective fluid streams 402 and 414 to impinge upon the corresponding substrate. Such targets may be printed or painted on either surface 420, 422, or the interior of the transparent calibration element 220. Although three targets 320 are shown in FIG. 6, any desired number of targets may be applied to the surface of the calibration element 220. The location of the targets 320 correspond to the corresponding location 424, 426 on a prior substrate 2 that an operator of the system directed the fluid stream 402 or 414, and observed a desired distribution of fluid over the surface 420, 422.

If both the calibration element 220 plus the enclosure 200 are transparent, then the viewer can view the fluid applied to both the upper surface and lower surface of the calibration element 220 to determine proper coverage of the calibration element 220 by the fluid streams 414 and 402 shown in FIG. 4. Fluid can be applied from adjustable nozzles 48 or 51 concurrently or consecutively, as desired such that the distribution of either or both fluid streams 402, 414 upon respective 48 surfaces 420, 422, can be observed. If portions of either the upper surface 420 or the backside 422 of the calibration element 220 are not covered adequately, then the respective adjustable nozzles 48 and 51 must be adjusted to provide the desired coverage. If, by comparison, both the upper surface 420 and the backside 422 of the calibration element 220 are being adequately covered by respective adjustable nozzles 48, 51, then it is known that the position of the adjustable nozzles will adequately cover any similarly-shaped substrate 2 having a similar surface finish that is placed on pedestal 36 when similar fluid pressure is applied through the adjustable nozzles.

Thus, when an adjustable nozzle 28 or 51 becomes misaligned due to use, shipping, contact, or some other action, the fluid stream from the adjustable nozzle will contact the substrate 2 at some other location than desired. The calibration element 220 with target 220 can be inserted in the SRD chamber 30 and the adjustable nozzles 48 and 51 are adjusted to cover their respective surfaces of the calibration element. The calibration element is then removed from the SRD chamber resulting in a readjusted and calibrated SRD chamber. Further substrates positioned in the SRD chamber 30 will then be covered properly by fluid impinging from the adjustable nozzles providing the same dimension and surface finish of the substrate. Thus, the calibration element 220 provides a quick, reliable, and inexpensive technique for accurate calibration and/or re-adjustment of the adjustable nozzles. The calibration of the adjustable nozzles 48, 51 may preferably be performed during first set-up of the SRD chamber 30, and as frequently as desired during operation of the SRD chamber 30. For example, if the SRD chamber is being used often, the calibration may be performed more frequently than of the SRD chamber is being used infrequently.

There are several techniques by which the calibration element 220 may be used to calibrate the adjustable nozzles 48, 51. First, when the pedestal arms 36a are not rotating and the pedestal is positioned in the lowered position as indicated in FIG. 5, fluid is applied through the respective adjustable nozzle 48, 51 at the desired target 320. If the respective fluid stream 402 or 414 impinges the calibration element 220 at a location that does not correspond to the target location 320, then the operator knows that the adjustable nozzles are misaligned. The respective adjustable nozzle 48 or 51 is then properly aligned either manually or automatically, such that the respective fluid stream 402 or 414 does impinge the calibration element 220 at target 320 (assuming that the fluid stream is being applied through the adjustable nozzles at the same pressure and/or flow rate at Which the calibration element was calibrated.

Once the respective fluid stream 402 or 414 does impinge the respective calibration element 220 at the correct target location 320 (while the calibration element 220 is not rotating), then the flow of fluid over the calibration element 220 is observed to ensure the fluid continuously covers the line 315 from the center 316 to the periphery 318 of the calibration element 220. If the entire line 315 is not aligned, the operator knows the adjustable nozzle and/or the pressure source to the applied to the adjustable nozzle 48 or 51 has to be adjusted until the entire line 315 is covered. When the entire line 315 is covered, the entire substrate will be covered considering rotation of the substrate.

As a final calibration step, the calibration element 220 is rotated by the pedestal 36 at the range of angular velocities that substrates 2 encounter during a typical SRD process. The flow of the fluid that is applied from the adjustable nozzle 48 or 51 over the calibration element 220 is observed (which is facilitated by the calibration element being formed from a transparent material) for any point on the surface of the calibration element 220 that is not adequately covered by the fluid. If there are any surface areas that are not covered, then the pressure of the fluid being applied through the adjustable nozzle 48 or 51 has to be modified until there is complete coverage. Provided that there is complete coverage of the surface of the calibration element, that particular adjustable nozzle is considered to be properly aligned with the respective surface of the calibration element 220 (or any substrate 2 having a similar shape and size as the calibration element.

The calibration element 220 is preferably calibrated for one adjustable nozzle 48, 51 at a time. As soon the calibration of one adjustable nozzle 48 or 51 is complete, fluid is turned off to that adjustable nozzle and the fluid is then applied to the other adjustable nozzle. The similar calibration procedure is then followed for the other surface of the calibration element 220 to adjust the other adjustable nozzle 51 or 48, respectively.

It should be noted that even though the above description describes calibrating adjustable nozzles 48 or 51 in an SRD chamber to generally cover an entire surface of a substrate, the same calibration technique can be used to apply a nozzle to a specific location on a substrate 2. For instance, it may be desired to apply an edge exclusion zone 6a as shown in FIG. 2 and described above. One specific adjustable nozzle may have to be calibrated to direct fluid from the adjustable nozzles 48 and 51 to form such an exclusion zone. Such precise positioning of the adjustable nozzles may be accomplished by directing the fluid from the adjustable nozzles 48, 51 at specific targets 320 shown in FIG. 6, and tightening the adjustable nozzles in position. The calibration element 220 is then removed from the SRD chamber 30; a substrate 2 is inserted into the SRD chamber 30; and the substrate is processed using the adjustable nozzles 48, 51 that are calibrated for that substrate. This calibration technique is quick, reliable, and highly repeatable.

Although various embodiments that incorporate the teachings of the present invention have been shown and described in detail herein, those skilled in the art can readily devise many other varied embodiments that still incorporate these teachings.

What is claimed is:

1. An apparatus comprising a calibration element having a similar contour as a substrate configured to be processed in a processing chamber and having one or more target marks disposed thereon to define one or more fluid delivery targets.

2. The apparatus of claim 1, wherein the target marks are disposed at a radial position to define an annular path on the calibration element during rotation of the calibration element.

3. The apparatus of claim 2, wherein the calibration element is made from a material of a similar frictional characteristics as the substrate.

4. The apparatus of claim 1, wherein the target marks are disposed proximate a peripheral portion of the calibration element.

5. The apparatus of claim 1, wherein the target marks are disposed proximate a center portion of the calibration element.

6. The apparatus of claim 1, wherein the target marks are disposed proximate a center portion of the calibration element and proximate a peripheral portion of the calibration element.

7. The apparatus of claim 1, wherein the calibration element is adapted to be positioned on a pedestal disposed inside the processing chamber.

8. The apparatus of claim 1, wherein at least one of the target marks is configured to be impinged by a fluid stream projecting from at least one adjustable nozzle disposed inside the chamber.

9. The apparatus of claim 8, wherein the position of the target marks is based on a pressure of the fluid stream projecting from the at least one adjustable nozzle.

10. The apparatus of claim 8, wherein the calibration element is made from a material of a similar frictional characteristics as the substrate so that an interaction between the fluid stream and the calibration element indicates an interaction between the fluid stream and the substrate.

11. The apparatus of claim 1, wherein the calibration element is transparent.

12. The apparatus of claim 1, wherein the calibration element is formed from one of a plastic or quartz.

13. The apparatus of claim 1, wherein the target marks are disposed on an upper surface of the calibration element and a lower surface of the calibration element.

14. The apparatus of claim 13, wherein the calibration element is made from a material of a similar frictional characteristics as the substrate.

15. The apparatus of claim 1, wherein the calibration element is made from a material of a similar frictional characteristics as the substrate.

16. A method of calibrating a processing chamber, comprising:

inserting a calibration element into the chamber having one or more adjustable nozzles, the calibration element having a similar contour as a substrate and comprising one or more target marks disposed on a surface of the calibration element; and directing fluid from the adjustable nozzles at the target marks.

17. The method of claim 16, wherein directing the fluid comprises aiming the fluid so that the fluid continuously extends from a center portion of the calibration element to the target marks.

18. The method of claim 16, wherein the target marks are disposed proximate a peripheral portion of the calibration element.

19. The method of claim 16, further comprising:

determining whether the fluid continuously extends from a center portion of the calibration element to a peripheral portion of the calibration element; and adjusting the adjustable nozzles until the fluid continuously extends from the center portion of the calibration element to the peripheral portion of the calibration element.

20. The method of claim 16, further comprising:

rotating the calibration element; and determining whether the surface of the calibration element is covered by the fluid.

\* \* \* \* \*